& Bramblett

United States Patent [19]
Yamaguchi et al.

[11] 4,280,064
[45] Jul. 21, 1981

[54] SIGNAL ISOLATOR

[75] Inventors: Keiki Yamaguchi; Shinichi Sano, both of Musashino, Japan

[73] Assignee: Yokogawa Electric Works, Ltd., Tokyo, Japan

[21] Appl. No.: 938,953

[22] Filed: Sep. 1, 1978

[30] Foreign Application Priority Data

Sep. 7, 1977 [JP] Japan ................................ 52/107511

[51] Int. Cl.³ ............................................. H03F 9/00
[52] U.S. Cl. ........................................ 307/149; 330/8; 307/401
[58] Field of Search .................... 307/17, 149, 2, 401, 307/89, 90, 106–108, 414–419, 150–157; 361/204; 330/8

[56] References Cited

U.S. PATENT DOCUMENTS

| | | | |
|---|---|---|---|
| 2,747,109 | 5/1956 | Montner | 307/106 X |
| 2,965,044 | 12/1960 | Johnson, Jr. | 307/2 X |
| 3,624,422 | 11/1971 | Suzuki | 307/108 |
| 3,731,183 | 5/1973 | Johnson et al. | 307/108 X |
| 4,073,003 | 2/1978 | Chambers | 307/17 |

Primary Examiner—L. T. Hix
Assistant Examiner—W. J. Brady
Attorney, Agent, or Firm—Parmelee, Johnson, Bollinger & Bramblett

[57] ABSTRACT

An improved signal isolator including two nonlinear circuits having nonlinear voltage-to-current characteristics, in which an input network is formed by connecting one of the nonlinear circuits in series with the primary winding of a transformer, and an output network is formed by connecting the other nonlinear circuit and an averaging circuit in series with the secondary winding of the transformer. A pulse signal is applied to the input network, the output network or the tertiary winding of the transformer to develop an output signal corresponding to the input signal while the input network and the output network are isolated from each other with respect to direct current.

9 Claims, 18 Drawing Figures $r_1 = \dfrac{R61+R62}{2}$ $r_2 = \dfrac{R63+R64}{2}$

SIGNAL ISOLATOR

BACKGROUND OF THE INVENTION

1. Field of the Invention

The present invention relates to an improved signal isolator for transmitting a small DC voltage signal in an isolated state, and more particularly to an improved signal isolator having means for isolating a DC voltage signal which has a magnitude of the order of millivolts, as, for example, the electromotive force (emf) of a thermocouple.

2. Description of the Prior Art

Signal isolators known to the art include flying capacitor systems using relay contacts, and transformer isolation systems based on pulse modulation. However, the use of relays creates problems with sampling speed and the length of useful service life because of the mechanical contacts. The pulse modulation isolators are also disadvantageous because they require a plurality of transformers for isolation of both an input signal and a control signal, thus rendering the structure complex.

SUMMARY OF THE INVENTION

The object of the present invention is to provide an improved isolator having a simple structure that does not require mechanical contacts.

DESCRIPTION OF THE PREFERRED EMBODIMENTS

Figure 1:
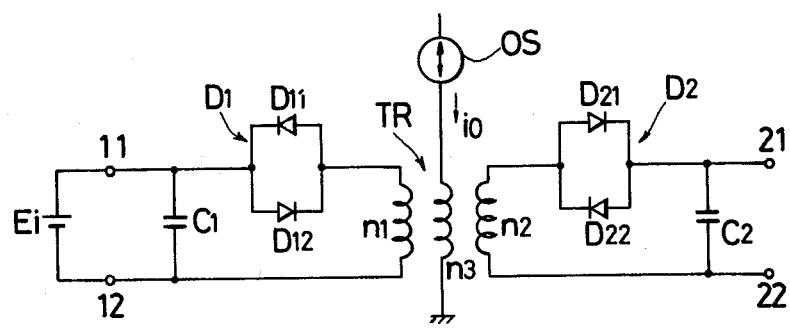
FIG. 1 is a circuit connection diagram of an embodiment of a signal isolator constructed in accordance with the present invention.

FIG. 1 is a circuit diagram of one embodiment of an improved signal isolator constructed in accordance with the present invention. An input DC voltage signal $E_i$ is applied to input terminals 11 and 12 and a capacitor $C_1$ is connected between the input terminals. A nonlinear circuit $D_1$, comprising parallel reverse-connected diodes $D_{11}$, $D_{12}$, is connected at one end to the upper input terminal 11. The other end of nonlinear circuit $D_1$ is serially connected with the primary winding $n_1$ of a transformer TR and back to the lower input terminal 12 to form an input network.

The transformer secondary winding $n_2$ is connected serially with a second nonlinear parallel-diode circuit $D_2$ to output terminals 21 and 22, to form an output network. A capacitor $C_2$ is connected between the output terminals, and serves as a signal averaging means.

In this embodiment, the circuit configuration is symmetrical on the primary and secondary sides with respect to the transformer TR. The transformer TR includes a tertiary winding $n_3$ which is connected to a pulse generator OS to function as will be explained.

Figure 2:
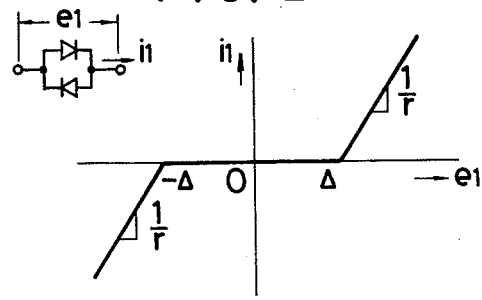
FIG. 2 graphically represents the characteristics of a parallel-diode circuit employed in the invention.

FIG. 2 graphically represents the characteristics of the parallel-diode circuits $D_1$ and $D_2$. An applied voltage $e_1$ and a flowing current $i_1$ have a nonlinear relation as indicated by the graph.

Figure 3:
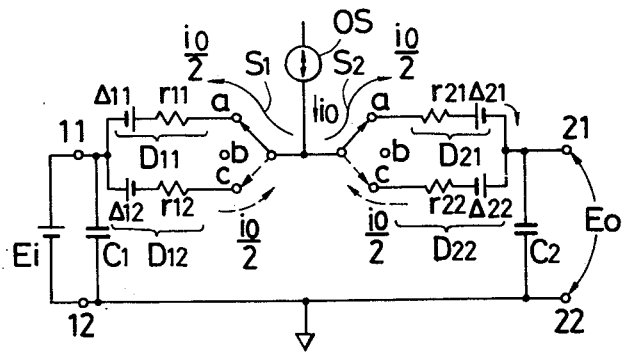
FIG. 3 shows an equivalent circuit corresponding to the circuit of FIG. 1.

If the turns of the primary winding $n_1$ and the secondary winding $n_2$ of the transformer TR are set to a ratio of 1:1 in an isolator as described above, and symmetrical positive and negative pulses are alternatively applied to the tertiary winding $n_3$, the operation of the circuit can be illustrated by an equivalent circuit as shown in FIG. 3. In such a circuit, switches S1 and S2 indicate the switching actions of diodes $D_{11}$–$D_{12}$ and $D_{21}$–$D_{22}$.

Upon application of a positive pulse from the pulse generator OS, the switches S1 and S2 are connected to contacts a to cause conduction of a current pulse through diodes $D_{11}$ and $D_{21}$. Upon application of a negative pulse, the switches S1 and S2 are connected to contacts c to cause conduction of a current pulse through diodes $D_{12}$ and $D_{22}$. When no pulse is applied from generator OS, the switches S1 and S2 are connected to contacts b to cause cutoff of all diodes. Each of the diodes $D_{11}$ through $D_{22}$ of FIG. 3 is represented by a series connection of a forward voltage $\Delta$ and a dynamic resistance r (forward resistance).

In the state where a positive current pulse $i_0$ is developed through the diodes by the pulse generator OS, the switches S1 and S2 are connected with the contacts a to cause the current to flow through diodes $D_{11}$ and $D_{21}$, thereby dividing the current pulse $i_0$ into two, as illustrated. One current pulse $i_0/2$ thus flows in each of the diodes $D_{11}$ and $D_{21}$. In this condition, the resultant output $E_{01}$ across the output terminals 21 and 22 is expressed as follows:

$$E_{01} = E_i + \Delta_{11} + (i_0/2)(r_{11} - r_{21}) - \Delta_{21} \qquad (1)$$

Similarly, in the state where a negative current pulse $i_0$ (equal in amplitude to the positive pulse) is applied, the resultant voltage $E_{02}$ across the output terminals 21 and 22 is expressed as follows:

$$E_{02} = E_i - \Delta_{12} - (i_0/2)(r_{12} - r_{22}) + \Delta_{22} \qquad (2)$$

The positive and negative pulses from the pulse generator OS are applied repeatedly. The respective positive and negative pulses are separated by a time period T, as shown in FIG. 4(a). If the capacitances of the capacitors $C_1$ and $C_2$ are sufficiently large enough to minimize the potential variation that occurs due to charge and discharge, resulting from the pulsations, the output voltage $E_0$ is the mean value of $E_{01}$ and $E_{02}$. Thus, using Equations (1) and (2), the following calculations can be made to derive an expression for output voltage $E_0$.

$$E_0 = \frac{E_{01} + E_{02}}{2} = E_i + \qquad (3)$$

$$\tfrac{1}{2}(\Delta_{11} - \Delta_{12} - \Delta_{21} + \Delta_{22}) + \frac{i_0}{4}(r_{11} - r_{12} - r_{21} + r_{22})$$

In Equation (3), if $$\Delta_{11} = \Delta_{12},\ \Delta_{21} = \Delta_{22},\ r_{11} = r_{12},\ r_{21} = r_{22}, \qquad (4)$$

then both the second and third terms are zero and the output voltage $E_0$ is equal to the input DC voltage $E_i$. Accordingly, the value of the DC voltage $E_i$ applied to the input network is obtained from the output network with electric isolation.

The conditions of Equation (4) can be readily satisfied by using diodes D11, D12, D21 and D22 having the same characteristics to constitute parallel-diode circuits, and maintaining them at the same temperature.

Figure 4:
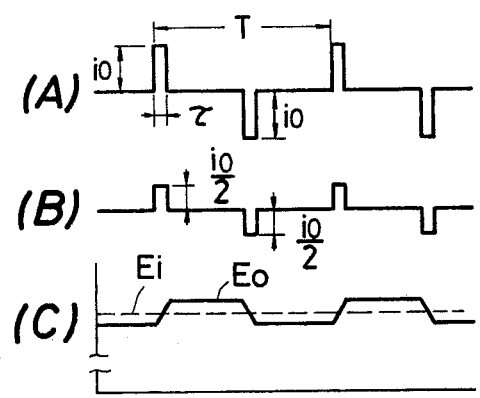
FIGS. 4A, 4B and 4C are waveform diagrams illustrating current and voltage behavior in the circuit shown in FIG. 3.

FIG. 4 is a waveform diagram illustrating the current and voltage behavior in the circuit of FIG. 3, in which FIG. (A) shows positive and negative impulses from the pulse generator OS, (B) shows divided currents flowing in parallel-diode circuits D1 and D2, and (C) shows an output voltage $E_0$, of which the ripple component is illustrated in an enlarged form.

According to the isolator of the present invention, the input resistance as viewed from the input DC voltage $E_i$ is determined to be $T/2\tau$ times the excitation impedance Z of the transformer TR. $\tau$ is the impulse width of the impulse $i_0$. The output resistance is $T/\tau$ multiplied by the dynamic resistance of the diode.

Figure 5:
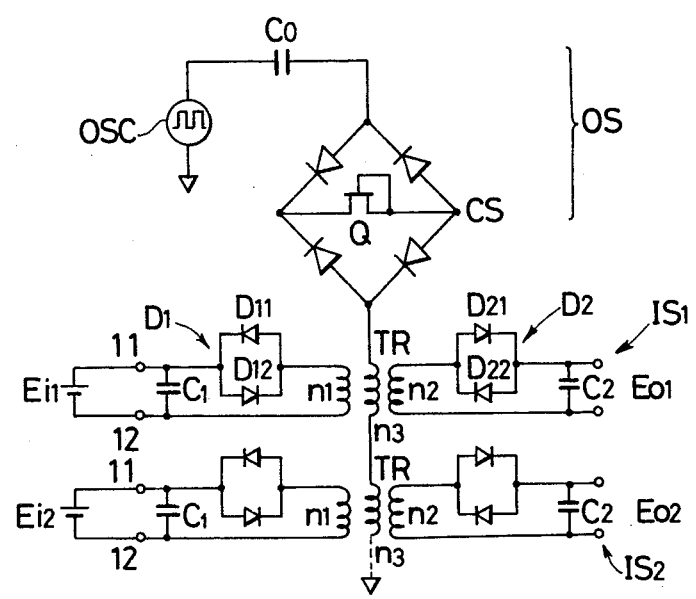
FIGS. 5 and 6 show circuit connection diagrams of other embodiments of the invention.
Figure 6:
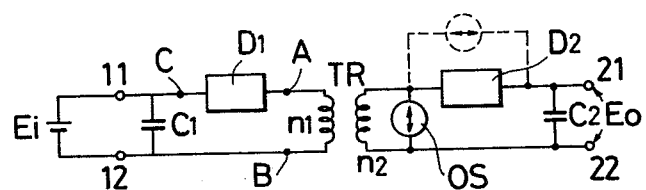

FIGS. 5 and 6 are circuit diagrams of other embodiments of the invention.

In the embodiment of FIG. 5, a plurality of isolators IS1, IS2 and so forth, are driven by a single impulse generator OS. The respective tertiary windings $n_3$ of the illustrated transformers are connected in series with each other, and impulses are applied thereto. The impulse generator OS has a rectangular-wave oscillator OSC, a capacitor $C_0$ for eliminating the DC component of the output signal from the oscillator OSC, and a positive-negative impulse current source CS. The current source CS includes a diode bridge circuit and a constant-current element Q which has the constant-current characteristic of a field effect transistor.

The circuit of FIG. 6 includes a transformer TR having a primary winding $n_1$ and a secondary winding $n_2$. A pulse generator OS is connected across the secondary winding $n_2$. This embodiment operates in the same manner as the circuit of FIG. 1. The pulse generator OS can be connected across the parallel-diode circuit D2 as shown by the broken line. It can also be connected across the primary winding $n_1$ (between A and B) or across the parallel-diode circuit D1 (between A and C).

Figure 7:
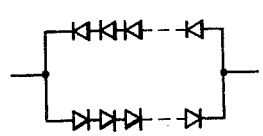
FIGS. 7 through 9 are electrical connection diagrams of other parallel-diode circuits.
Figure 8:
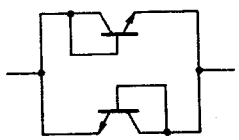
Figure 9:
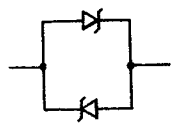

FIGS. 7 through 9 are connection diagrams of other parallel-diode circuits D1 and D2 which can be used in the invention.

In the circuit of FIG. 7, different groups of diodes connected in series with each other are shown. These groups are themselves connected in parallel with each other. In this configuration, it is possible to adjust the forward voltage Δ or the dynamic resistance r by varying the number of series-connected diodes.

In the circuit of FIG. 8, transistors are diode-connected in parallel with each other and are connected to be opposite in polarity for conduction in opposite directions.

FIG. 9 shows a circuit in which zener diodes are connected in parallel with each other.

In the above examples, the ratio of turns of the primary winding $n_1$ and the secondary winding $n_2$ of transformer TR does not always have to be 1:1, and the capacitor C1 does not always have to be connected between the input terminals 11 and 12. Instead of connecting the capacitor C2 between the output terminals 21 and 22, it is possible to utilize the stray capacitance of an integrator formed from an operational amplifier and a capacitor or that of a low-pass filter or leadwires. Additionally, the circuit configuration can be modified to produce the output voltage $E_0$ across the diode circuit D2 because the secondary winding $n_2$ can be a conductor of direct current.

As described above, the present invention provides an improved isolator having the improvements listed below:

(i) The structure is simplified and compact because it is entirely formed from a transformer, parallel-diode circuits and capacitors.

(ii) The elimination of mechanical contacts provides a highly reliable isolator having a long operating lifetime.

(iii) Enhanced accuracy is achieved by using elements having the same characteristics to form the parallel-diode circuits.

(iv) Use of an isolated power source and a control signal is eliminated by connecting a pulse generator with the tertiary or secondary winding of a transformer, thus ensuring intrinsic safety.

Figure 10A:
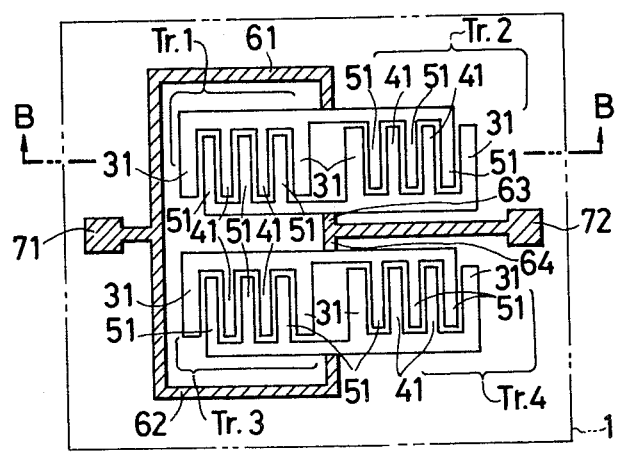
FIG. 10A is a plan view showing the configuration of a parallel-diode circuit formed in semiconductive material.
Figure 10B:
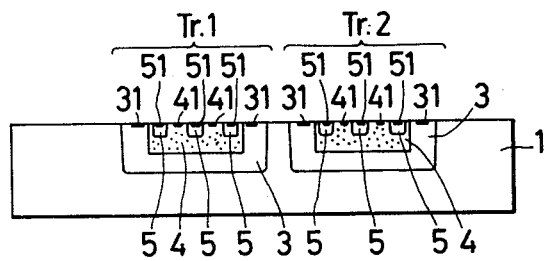
FIG. 10B is a sectional view taken along line B—B in FIG. 10A.
Figure 10C:
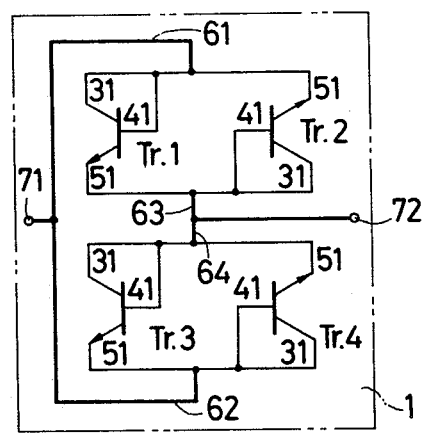
FIG. 10C is a circuit diagram of the arrangement of FIG. 10A.

FIGS. 10A and 10B shows an example of a parallel-diode circuit based on the use of semiconductors, and FIG. 10C shows the circuit arrangement. The device comprises a substrate 1 providing collectors 3, bases 4 and emitters 5, forming four transistors Tr1 through Tr4 which are disposed in proximity to each other on the substrate 1.

In each transistor, a collector electrode 31 is coupled to the collector 3; a base electrode 41 is coupled to the base 4; and an emitter electrode 51 is coupled to the emitter 5.

The collector electrode 31 and the base electrode 41 are connected with each other, and each of the transistors Tr1 through Tr4 functions like a diode. In adjacent transistors Tr1 and Tr2, the collector electrode 31 and the base electrode 41 of transistor Tr1 are connected with the emitter electrode 51 of transistor Tr2. The emitter electrode 51 of transistor Tr1 is connected with the collector electrode 31 and the base electrode 41 of transistor Tr2.

Similarly, in adjacent transistors Tr3 and Tr4, the collector electrode 31 and the base electrode 41 of transistor Tr3 are connected with the emitter electrode 51 of transistor Tr4. The emitter electrode 51 of transistor Tr3 is connected with the collector electrode 31 and the base electrode 41 of transistor Tr4.

As seen from FIG. 10C, terminals 71 and 72 are connected to an external circuit (not shown). A leadwire 61 connects the terminal 71 with the collector electrode 31, the base electrode 41 of transistor Tr1, and the emitter electrode 51 of transistor Tr2; a leadwire 62 connects the terminal 71 with the emitter electrode 51 of transistor Tr3, and the collector electrode 31 and the base electrode 41 of transistor Tr4. A leadwire 63 connects the terminal 72 with the emitter electrode 51 of transistor Tr1, and with the collector electrode 31 and the base electrode 41 of transistor Tr2. A leadwire 64 connects the terminal 72 with the collector electrode 31 and the base electrode 41 of transistor Tr3, and with the emitter electrode 51 of transistor Tr4.

Figure 11A:
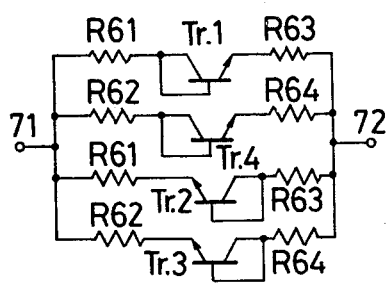
FIG. 11A shows an equivalent circuit analogous to the circuit of FIG. 10C.
Figure 11B:
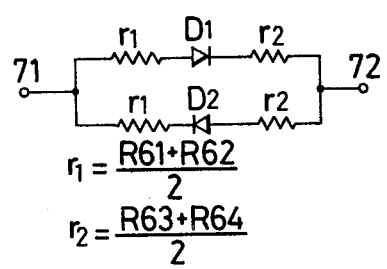
FIG. 11B is a further simplification of the circuit of FIG. 11A.

An equivalent to the above-described circuit configuration as viewed from the terminals 71 and 72 is shown in FIG. 11A, in which transistors Tr1 and Tr4 are disposed along a diagonal line on the substrate. These transistors are connected in parallel to each other in the forward direction from the terminal 71 to the terminal 72. Similarly, transistors Tr2 and Tr3 are disposed along another diagonal line and are connected in parallel to each other in the forward direction from the terminal 72 to the terminal 71.

In this circuit, R61 through R64 represent the respective resistance values of the leadwires. An equivalent circuit of that of FIG. 11A can be further simplified as illustrated in FIG. 11A, as described below.

Resistances r1 and r2, which are connected in series with the diodes D1 and D2, can be expressed as follows:

$$r1 = (R61 + R62)/2 \quad (5)$$

$$r2 = (R63 + R64)/2 \quad (6)$$

The leadwire 61 is of the same length and width as leadwire 62, and the leadwire 63 is of the same length and width as leadwire 64. Thus, the resistance of leadwire 61 equals the resistance of leadwire 62, and the resistance of leadwire 63 equals the resistance of leadwire 64. That is, R61=R62 and R63=R64.

Even if such a relationship between the leadwire resistances is not satisfied, it is possible to attain, on both sides of D1 and D2, accurate equalization of the sum of the resistances r1 and r2 connected in series with each of the diodes. This is obvious from Equations (5) and (6). The forward voltages $\Delta 1$ and $\Delta 2$ of diodes D1 and D2 can be expressed by the following equations, in which e1 through e4 are forward voltages of transistors Tr1 through Tr4 connected with the diodes.

$$\Delta 1 = (e1 + e4)/2 \quad (7)$$

$$\Delta 2 = (e2 + e3)/2 \quad (8)$$

Figure 12:
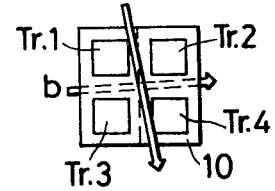
FIG. 12 is a schematic diagram illustrating the operation of the circuit shown in FIG. 10.

The forward voltages e1 through e4 are adjustable to obtain a relation of e1=e2=e3=e4 by making the transistors Tr1 through Tr4 under the same condition. Moreover, when a temperature gradient to the substrate 10 (as indicated by an arrow a in FIG. 12) exists, the relationship of e1=e2 and e3=e4 is maintained. If a temperature gradient (as indicated by an arrow b of FIG. 12) exists, the relation of e1=e3 and e2=e4 is maintained so that, as is obvious from Equations (7) and (8), the relationship of $\Delta 1 = \Delta 2$ can be maintained in each case without any influence of the temperature gradient.

Consequently, according to the parallel-diode circuits of the aforementioned configuration, the condition of Equation (4) can be completely satisfied.

Although in the foregoing embodiments the diode-connected transistors are employed on the substrate 10, diodes can be used in place of the transistors.

I claim:

1. An isolator comprising a transformer having a primary winding and a secondary winding, first and second non-linear circuits having nonlinear voltage-to-current characteristics, each of said nonlinear circuits including a pair of diodes having the same characteristics connected in parallel with each other with opposite polarities, means connecting said first nonlinear circuit in series with said primary winding to form an input network, means connecting said second nonlinear circuit in series with said secondary winding to form an output network, averaging means connected to said output network, and means for applying pulse signals to one of said networks, the input network and the output network being isolated from each other with respect to direct current.

2. An isolator as defined in claim 1, wherein said nonlinear circuits are comprised of transistors which are diode-connected in parallel with each other and are so directed as to be opposite in polarity.

3. An isolator as defined in claim 1, wherein said nonlinear circuits are comprised of zener diodes which are connected in parallel with each other and are so directed as to be opposite in polarity.

4. An isolator as defined in claim 1, wherein said means for applying a pulse signal is a pulse generator comprising a rectangular-wave oscillator and a positive-negative impulse current source, said current source including a constant-current element and a diode bridge circuit to receive the output of said rectangular-wave oscillator through a capacitor.

5. An isolator as defined in claim 1, wherein said averaging means includes a capacitor.

6. An isolator as defined in claim 1, wherein said averaging means is formed by utilizing stray capacitance.

7. An isolator as defined in claim 1, wherein the output voltage is obtained across the averaging means.

8. An isolator as defined in claim 1, wherein an output voltage is obtained across the nonlinear circuit in the output network.

9. An isolator as defined in claim 1, wherein each of said nonlinear circuits includes a first terminal, a second terminal and four diode-connected transistors disposed in the proximity of one another on a substrate, one group of said transistors being located on a diagonal line between said first and second terminals and being connected in parallel with each other in the forward direction from the first terminal to the second terminal, and the other group of said transistors being located on another diagonal line and being connected in parallel with each other in the forward direction from the second terminal to the first terminal.

* * * * *